United States Patent [19]

Heckaman et al.

[11] Patent Number: 5,023,624

[45] Date of Patent: Jun. 11, 1991

[54] MICROWAVE CHIP CARRIER PACKAGE HAVING COVER-MOUNTED ANTENNA ELEMENT

[75] Inventors: Douglas E. Heckaman, Indialantic; Jeffrey A. Frisco, Palm Bay; Gregory C. Rieder, Satellite Beach; Edward J. Bajgrowicz, Palm Bay, all of Fla.

[73] Assignee: Harris Corporation, Melbourne, Fla.

[21] Appl. No.: 262,793

[22] Filed: Oct. 26, 1988

[51] Int. Cl.$^5$ .......................... H01Q 1/22; H01Q 1/38
[52] U.S. Cl. .................................... 343/860; 343/878; 343/786; 343/700 MS; 333/33; 333/247
[58] Field of Search ................. 343/700 MS, 786, 860, 343/702, 701, 878, 853; 357/74, 80; 361/401, 381; 333/33, 247; 174/52.3, 52.4

[56] References Cited

U.S. PATENT DOCUMENTS

| Re. 32,369 | 3/1987 | Stockton et al. | 343/700 MS |
| 3,549,949 | 12/1970 | Granberry | 361/381 |
| 4,527,165 | 7/1985 | deRonde | 343/778 |
| 4,654,694 | 3/1987 | Val | 361/401 |
| 4,771,294 | 9/1988 | Wasilovsky | 343/853 |
| 4,819,004 | 4/1989 | Argintaru et al. | 343/778 |

OTHER PUBLICATIONS

Mailbux et al., "Microstrip Array Technology", IEEE Trans. on Antennas and Prop., vol. AP-29, No. 1, Jan. 1981, pp. 25–37.

*Primary Examiner*—Michael C. Wimer
*Attorney, Agent, or Firm*—Evenson, Wands, Edwards, Lenahan & McKeown

[57] ABSTRACT

A package for a microwave circuit chip and associated microstrip antenna is formed of a multi-layer ceramic laminate within which is supported a microwave chip carrier and on an outer surface of which a microstrip antenna disposed. A first ceramic layer is supported on metallic base member and contains signal lines for interfacing the chip with the external world. Disposed atop the first ceramic layer is a second ceramic layer which forms a protective seal ring around the perimeter of the chip. A third ceramic cover layer is mounted atop the seal ring layer and contains one or more antenna elements on its outer surface. Signal line connections between the chip and the antenna elements are effected through tuned networks that extend from signal leads on the chip to conductors on the first ceramic layer. Signal connections from the first ceramic layer to the antenna on the cover may be formed by conductive vias through the ceramic seal ring layer or conductors along sidewalls of the seal ring layer and cover. Preferably, the first layer and the seal ring layer contain a ground plane vias distributed around the perimeter of the chip, to provide electrical continuity between the metal base member and a ground plane on the interior surface of the cover.

27 Claims, 13 Drawing Sheets

MICROWAVE CHIP CARRIER PACKAGE HAVING COVER-MOUNTED ANTENNA ELEMENT

FIELD OF THE INVENTION

The present invention relates in general to monolithic microwave circuit packaging structures and is particularly directed to a protective/support housing for ceramic microwave chip carrier having a cover-mounted antenna element.

BACKGROUND OF THE INVENTION

Through refinements in circuit design and semiconductor processing methodologies it has now become possible to integrate in a monolithic miniaturized packaging scheme substantially all of the components of which an RF communication system may be configured. As the demand for higher operational frequencies and bandwidth utilization has increased, however, the use of a high performance support substrate (e.g. GaAs) as both a signal processing environment and a radiation site has been limited by the size of and the unwanted mutual coupling between the antenna elements and the components of adjacent signal processing networks. As a consequence, separate support structures are conventionally employed for the antenna elements and the microwave chip carriers that contain the signal processing circuitry, yielding an overall packaging scheme that is largesized and therefore not necessarily optimized for use with complex communication/avionics equipment such as that incorporated in high performance military aircraft.

SUMMARY OF THE INVENTION

In accordance with the present invention, the shortcomings of conventional packaging/support structures for miniaturized monolithic RF communications systems are obviated by a new and improved packaging configuration which enables both the signal processing circuitry components of the system and their associated radiation elements to be integrated in a compact protective/support structure that is capable of meeting conformal mounting needs of advanced technology aircraft designs and readily lends itself to applications where high density and low cost are required, such as phased array systems.

For this purpose, the packaging scheme of the present invention embodies a housing structure comprised of a stacked, multi-layer ceramic package within which is supported a microwave chip. A first ceramic layer of the multi-layer package is ring supported on a thermally and electrically conductive base or floor member and contains signal conductor lines for interfacing the chip with the external world. The signal lines are disposed on a surface of the first ceramic layer that is substantially coplanar with that surface of the antenna MMIC on which its leads are located, thereby facilitating low loss interconnections between the leads of the MMIC and the signal conductors of the first ceramic layer to the external world.

Disposed atop the first ceramic layer is a second ceramic layer which forms a protective seal ring around the perimeter of the MMIC. A third metallized ceramic or metal layer, which forms the cover for the housing structure, is mounted atop the seal ring layer and may contain one or more antenna elements on its outer surface. Signal connections between the MMIC and the antenna elements are effected through (inductively and capacitively) tuned wire or ribbon links that extend from signal leads along the edge of the chip to signal conductors on the first ceramic layer. Signal connections from the signal conductors on the first ceramic layer to the antenna elements on the outer surface of the third ceramic layer are achieved by way of conductive vias through the ceramic seal ring layer or conductors that extend along the outside of the seal ring layer and the third ceramic layer.

Preferably, both the first ceramic layer and the seal ring ceramic layer also contain a plurality of ground plane vias distributed around the perimeter of the MMIC which provide electrical continuity between the conductive or metalized-ceramic support base or floor member on which the MMIC is mounted and a ground plane layer on the interior side of the third ceramic layer so as to provide a shielding cage around the MMIC.

The antenna elements may be configured as patch elements, such as electroformed metal layers on the outer surface of the third ceramic (cover) layer, or waveguide horn elements, flangemounted to a ground plane metallization on the outer surface of the third ceramic layer. A further microstrip metallization is formed on the outer surface of the third ceramic layer to provide a launch probe for the waveguide.

For interfacing the chip carrier with the external world, the signal conductors of the first ceramic layer extend to a plurality of conductive pins distributed along the perimeter of the first ceramic layer and extending through the base member. Preferably, each of the chip connection wires or ribbons, the signal conductors on the first ceramic layer, and the pins, are dimensioned and shaped to provide impedance matching between the MMIC and external connections to which the pins are joined.

DETAILED DESCRIPTION

Figure 1:
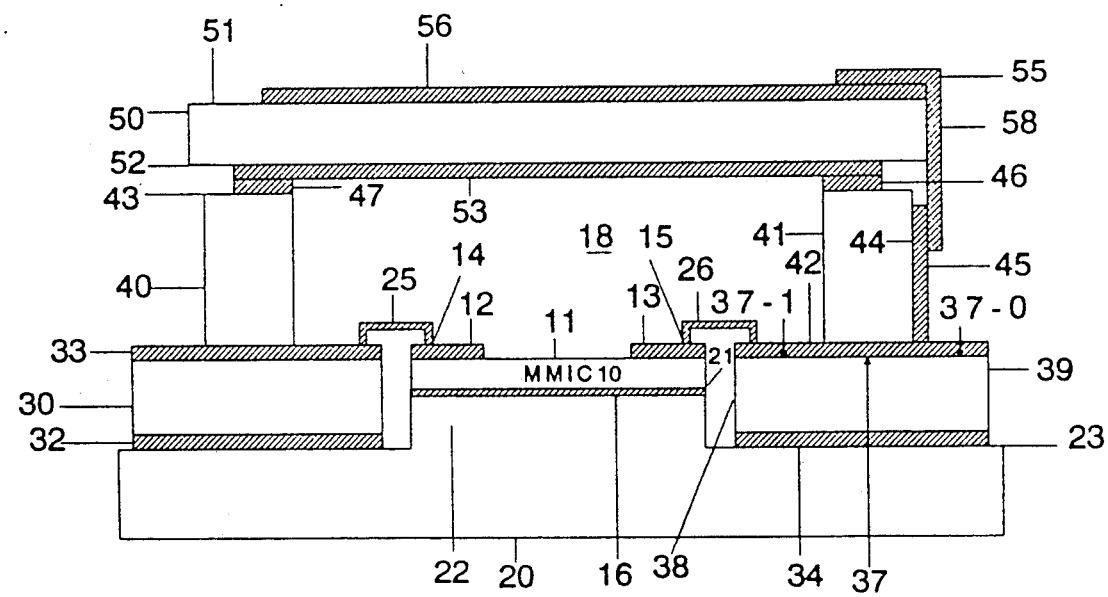
FIG. 1 is a diagrammatic side view of a configuration for packaging one or more microwave integrated circuit components and an associated antenna element in accordance with an embodiment of the present invention.

Referring now to FIG. 1, there is shown a diagrammatic side view of a configuration for packaging one or more microwave integrated circuit components and an associated antenna element in accordance with the present invention. The microwave integrated circuit component itself is shown as a monolithic microwave integrated circuit (MMIC) chip 10 having an upper surface 11 upon which component signalling leads 12 and 13 and associated bonding pads 14 and 15, distributed along the edges of the chip, are formed. The bottom surface 16 of the chip is thermally and conductively attached to the top surface 21 of a mesa portion 22 of a carrier support base or floor member 20. For this purpose, where support base member 20 is comprised of insulator (e.g. ceramic) material, the entire bottom surface of the chip 10 may be braze-bonded to a metallic (e.g. gold, copper-tungsten alloy) layer provided on the base member. Preferably, however, base member 20 is metallic throughout (e.g. a copper/tungsten alloy plate having a thickness on the order of 0.015"), so as to provide an electrical ground plane and thermal heat sink for the package.

The mesa portion 22 of the base member 20 rises vertically from a surrounding annularly-shaped floor portion 23, which extends radially outwardly from the mesa portion 22. In plan, the annular portion 23 may be any suitable geometric configuration, but is preferably rectangular or square-shaped, in order to facilitate compactly nesting a plurality of the packages on a common support structure (such as an airframe).

Situated on the annular floor portion 23 of the base member 20 is a first ceramic layer 30 having a top surface 31 and a bottom surface 32. The thickness of the ceramic layer 30 is such that its height above the annular floor portion 23 of base member 20 is substantially coplanar with the top surface 11 of the chip 10, so as to minimize inductive reactance and thereby facilitate the formation of matched impedance connections between the pads on the chip 10 and signal conductors provided on the top surface 31 of ceramic layer 30. A typical range of thickness for ceramic layer 30 is from 0.010" to 0.020".

The signal conductors are shown in FIG. 1 as a thin conductive layer 33 disposed atop surface 31 of ceramic layer 30. The bottom surface 32 of ceramic layer 30 is preferably braze-bonded to the annular surface portion 23 of base member 20, as by way of a metallic interface layer 34 of Au-Ge alloy, thereby hermetically sealing ceramic layer 30 to the annular floor portion 23 of support base member 20.

Electrical (wire bond) connections between the signal pads 14 and 15 of the chip 10 and the signal conductors 33 along the top surface 31 of ceramic layer 30 ar shown diagrammatically as bonding leads 25 and 26 such as gold or aluminum leads or ribbons having a length on the order of 0.010" and a diameter/thickness on the order of 0.001", which inherently impart unwanted inductive reactance into the signal path from the chip 10 to the external world and, consequently, require the use of some form of compensating network to provide an impedance match between the chip and external connection points. For this purpose, selected portions of the signal conductors 33 atop ceramic layer 30 may be configured to form an LC tuning network, which provides the requisite compensation. Examples of such tuning networks will be described in detail below in conjunction with the description of FIGS. 4, 5 and 6. For purposes of the present description, it will be assumed that the signal conductors 33 are suitably configured to form such networks and effectively 'tune out' the inductive reactance imparted by bonding leads 25 and 26, and provide impedance matching between the chip 10 to those portions of signal conductor 33 which extend beyond outside edge 39 of ceramic layer 30.

Supported on and hermetically sealed with the top surface 31 of ceramic layer 30 is a second ceramic layer 40 which forms a wall or sealing ring around an internal cavity 18 of the package in which the chip 10 is disposed. The interior wall 41 of ceramic layer 40 is offset in the radial or horizontal direction from the interior wall 38 of ceramic layer 30, so as to provide a region 37-I, whereat signal conductor 33 may be shaped to provide the above-referenced LC compensation network.

The outer wall 44 of second ceramic layer 40 is offset inwardly from the outer edge 39 of first ceramic layer 30, so as to provide a region 37-0 over which signal conductor 33 extends for engagement with one or more external connectors, to be described below, for interfacing the package with an external transmission line. To hermetically seal ceramic layer 40 with ceramic layer 30, layers 30 and 40 are preferably joined together at region 42 through a co-fired sealing process.

Extending vertically along the outer wall 44 of sealing ring ceramic layer 40, is an additional conductive layer or ribbon 45 of gold or copper, for example, which may be welded or soldered to signal conductor 33. Conductive layer 45 serves to provide an electrical connection from signal conductor 33 on ceramic layer 30 to an antenna element on the outer surface of a third, ceramic cover layer 50. Cover 50 may be multilayer Kovar/ceramic/gold or additional layers depending on the particular radiation element employed.

More particularly, a third ceramic layer 50, which serves as the cover of the package, is supported on the top surface 43 of sealing ring ceramic layer 40. Preferably, the bottom surface 52 of ceramic layer 50 has a conductive (e.g. copper or gold on tungsten) layer 53, which serves as a ground plane for the antenna. This conductive layer 53 is preferably braze-bonded to a conductive layer 46/47 of gold or Tungsten formed over the top surface 43 of sealing ring ceramic layer 40. Ground plane conductive layer 53 is electrically connected to the metallic base support 20 through conductive vias (to be described below but not shown in FIG. 1) which extend through ceramic layer 30 and sealing ring layer 40.

The antenna itself may be a microstrip antenna element, comprised of a thin conductive (e.g. copper or gold) layer 56 selectively formed on the top surface 51 of ceramic cover layer 50. Electrical connection from signal conductor 33 on the top surface 31 of ceramic layer 30 to the patch antenna layer 56 may be accomplished by means of a wrap-around ribbon connection, shown as an L-shaped ribbon conductor 55, which is bonded to patch antenna layer 56 on the top surface of ceramic cover layer 50 and to signal conductor 4 which extends vertically along the outer wall 44 of sealing ring layer 40, as described above.

Figure 2:
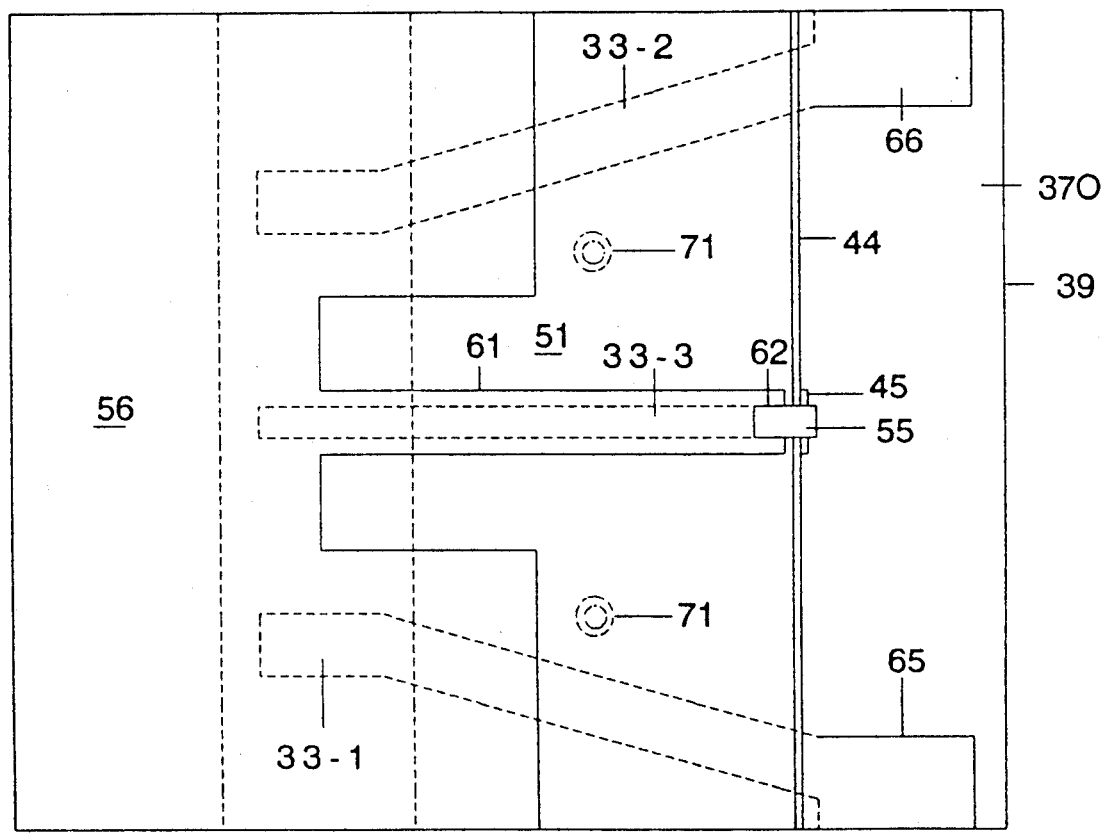
FIG. 2 shows a partial plan view of the package illustrated in FIG. 1, depicting the attachment of a patch antenna on the top surface of the cover layer and the extension of signal conductors beyond the outer perimeter of the sealing ring layer.

FIG. 2 shows a partial plan view of the package illustrated in FIG. 1, depicting, in particular, the manner of attachment of the patch antenna 56 at the top surface 51 of cover layer 50 and the extension of signal conductors 33 beyond the outer perimeter of sealing ring layer 40. As shown therein, electrical connection to the patch antenna layer 56 may be effected by providing the patch antenna with a finger portion 61 which extends to a region 62 adjacent to the sidewall or edge 58 of protective cover layer 50. L-shaped ribbon conductor 55, described above with reference to FIG. 1, extends around sidewall 58 and is bonded to finger portion 61 of antenna 56 element at region 62. That portion of the signal conductor 33 to be connected to the patch antenna element 56 is shown beneath finger portion 61 as conductor 33-3.

Additional portions of the signal conductor 33 are shown at 33-1 and 33-2, which extend along spaced-apart portions of the top surface 31 of ceramic layer 30 beyond end wall 44 of sealing ring layer 40 and terminate at pads 65 and 66. External connections to the package may be provided by bonding signal transmission line conductors to the pads 65 and 66. Also shown in FIG. 2 are a plurality of conductive vias 71 through which ground plane connections between the ground plane layer 53 on the interior surface of ceramic coverage layer 50 and metallic base member 20 are provided. The configurations of such conductive vias for cover-to-base member ground connections are illustrated in detail in FIG. 3, which is a partial side view of an enlarged portion of the package shown in FIG. 1.

Figure 3:
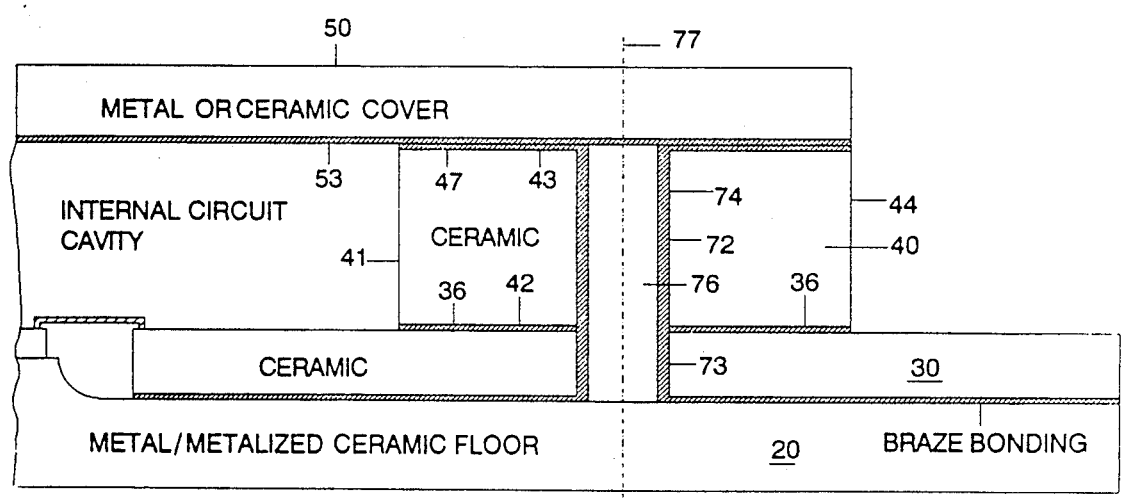
FIG. 3 is a partial side view of an enlarged portion of the package shown in FIG. 1.

More particularly, with reference to FIG. 3, a cylindrical aperture or via 71 is formed through each of ceramic layers 30 and 40. As shown therein, coaxial cylindrical apertures 72 and 73 are coated with a conductive layer 74 which extends to base member 20, upon which layer 30 is supported, and to a conductive layer 47 which extends along the top surface 43 of sealing ring layer 40. Preferably, the interior 76 of a respective via is filled with a conductive material, such as a metallic paste of tungsten, so as to provide a substantial ground plane connection through the sealing ring or wall portion of the package. By distributing these conductive top-to-bottom collecting vias around the entirety of the perimeter of cavity 18, there is effectively formed a shielding 'cage' around chip 10. This cage also conducts the radiation element ground currents down to layer 20, then to the overall structure.

Figure 4:
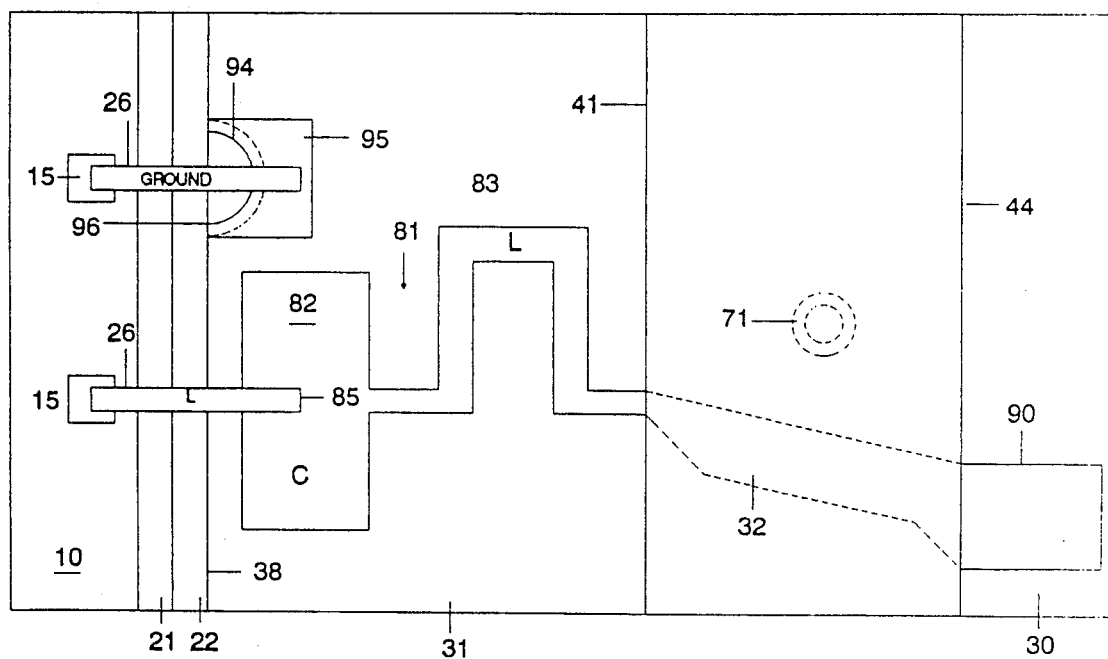
FIG. 4 shows a plan view of an enlarged portion of FIG. 1 depicting the incorporation of an L-C-L low pass filter type of tuning network into the signal conductor structure.

As described above with reference to FIG. 1, the wire bonds 25 and 26 which join the bonding pads on the chip 10 to the signal conductors 33 on ceramic layer 30 ar inherently inductive and constitute a substantial unwanted reactance on the transmission. To provide an impedance match between the bonding pads of the chip and connection points on the outside of the package, it may be necessary to incorporate a tuning network into the signal path structure. Such a network is shown in FIG. 4 as being comprised of a selectively formed conductor layer 81 having a large surface area capacitance region 82 (e.g. a layer of copper having an area of 0.020" X 0.030") and a tortuous path-shaped inductance region 83 (e.g. having a width on the order of 0.003" and a length on the order of 0.040"). Preferably, to facilitate manufacture of the package, these capacitance and inductance regions are incorporated into the signal conductor 33 itself.

Bonding wire 26 from chip pad 15 (which is inherently inductive, as noted above) is connected to the capacitance region 82 of network 81. With the inductance region 83 extending from capacitance region 82, there is effectively formed an L-C-L low pass type filter so as to provide an impedance match (e.g. on the order of 50 ohms) between the chip 10 and signal conductor 33 at connection pad 90 thereof outside the sealing ring ceramic layer 40.

Also shown in the plan view of FIG. 4 is an additional low inductance via 94 which extends through ceramic layer 30 to the metallic base member 20. A metallic layer 95 of gold or tungsten is formed on the surface 31 of ceramic layer 30 contiguous with the via 94, so as to provide a connection point for wire bond 26 between the chip and the via. The via itself has a conductive sidewall 96 of gold or tungsten which extends to the metallic base member 20.

Figure 5:
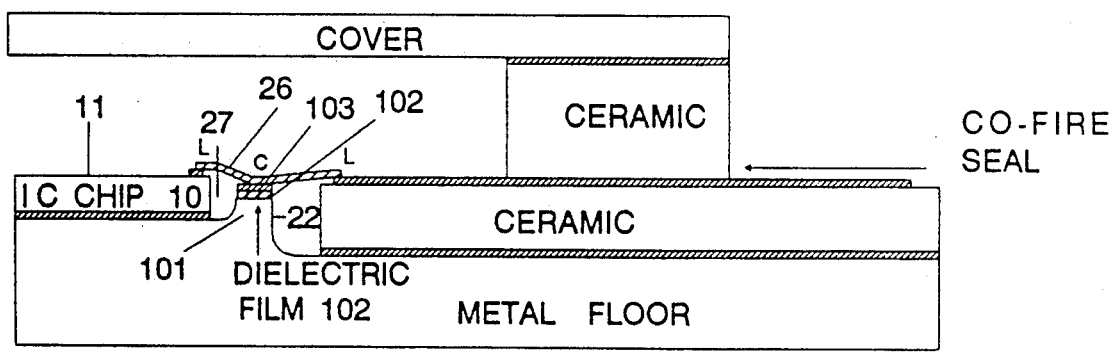
FIGS. 5 and 6 show an alternative scheme for providing a tuning network between a microwave circuit chip and signal conductors on a ceramic layer.
Figure 6:
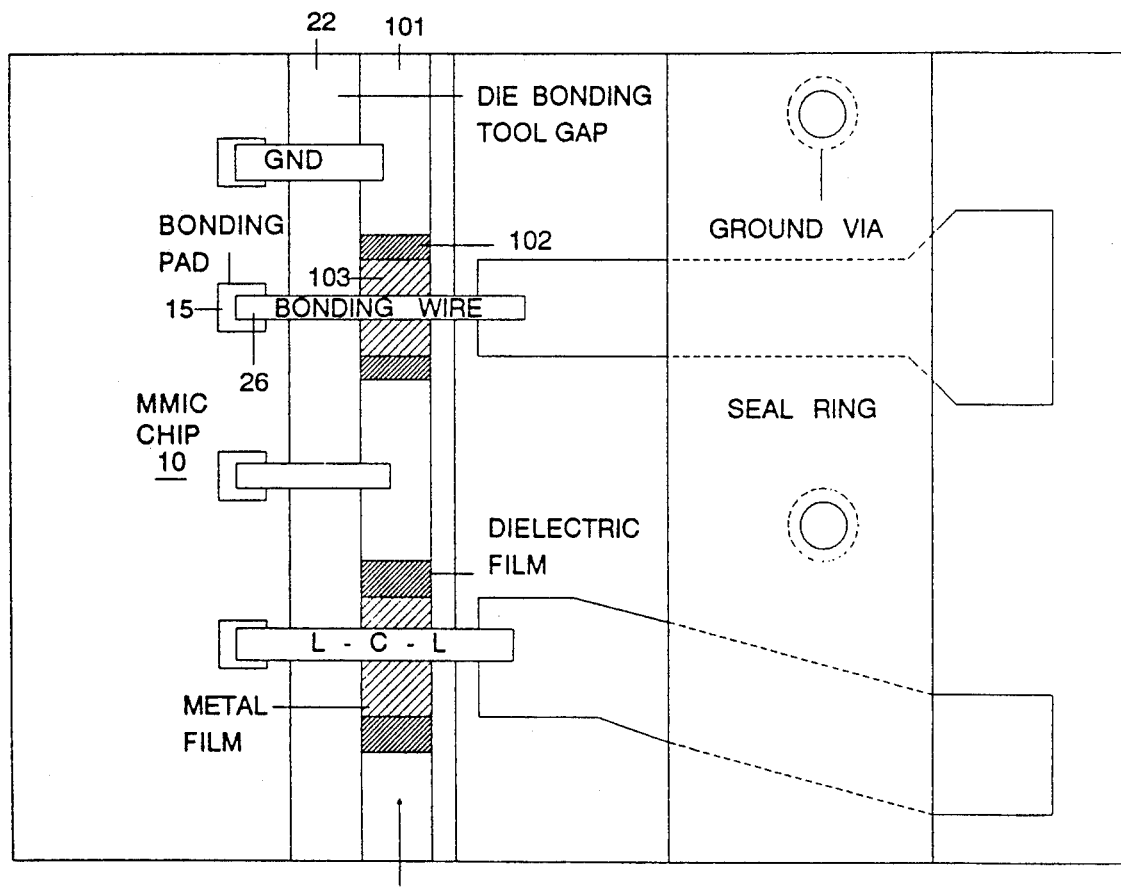

FIGS. 5 and 6 show an alternative scheme for providing a tuning network between the chip 10 and the signal conductors 33 on ceramic layer 30. In the modification of the package configuration shown in these Figures, the mesa portion 22 of the metallic base member 20 has a depression 27 in which the chip 10 is supported. Around the perimeter of the depression 27 is a lip or bar 101. A laminate structure of a dielectric film 102 of polyamide, alumina or SiO$_2$, having a thickness on the order of 0.003" and an area on the order of 0.015 X 0.030 and a metallic film 103 of gold is provided on the top surface of the lip 101. Bonding wire 26 is attached to the metallic film 103, so as to form a capacitor thereat. As a result, there is formed a tuning network formed of an L-C-L network between bonding pad 15 on chip 10 and signal conductor 33 on ceramic layer 30.

Figure 7:
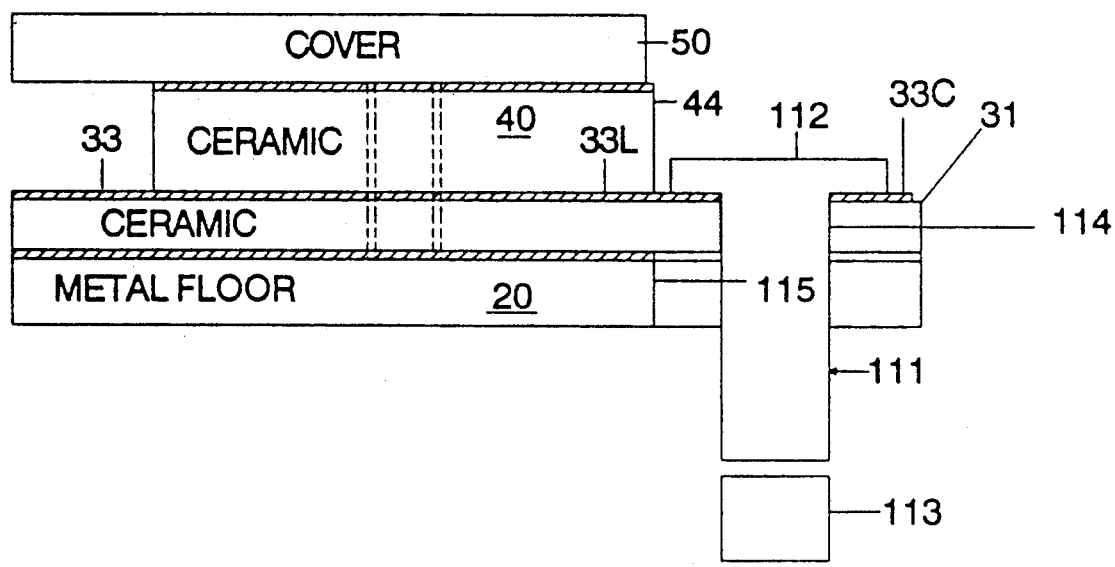
FIGS. 7 and 8 illustrate an embodiment of a scheme for providing external connections to signal conductors at those portions overlying a ceramic layer beyond the outer perimeter of the sealing ring layer.
Figure 8:
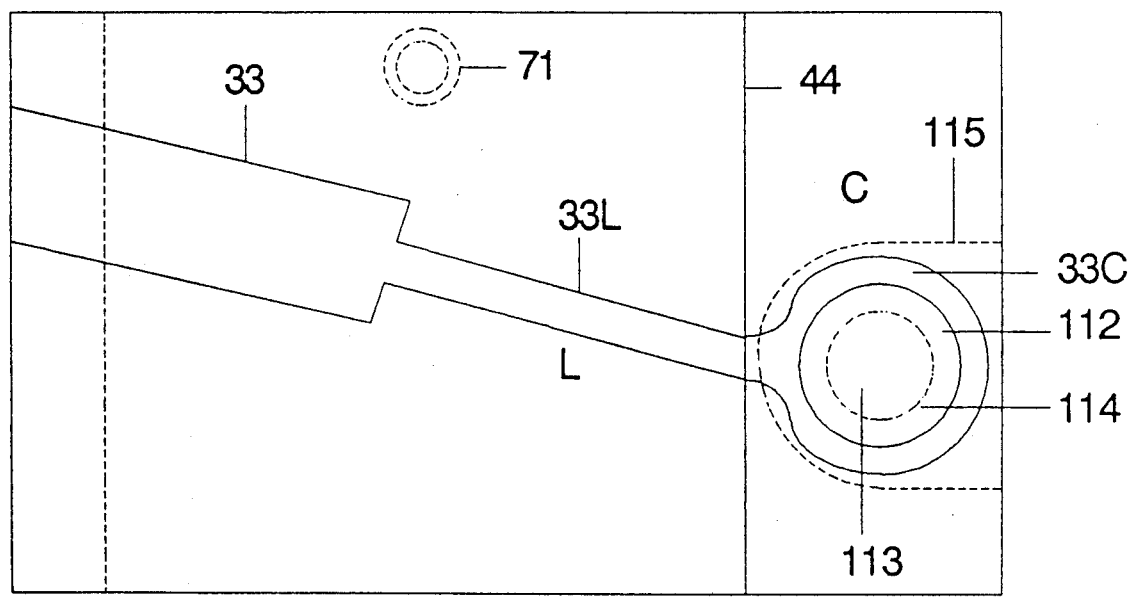
Figure 9:
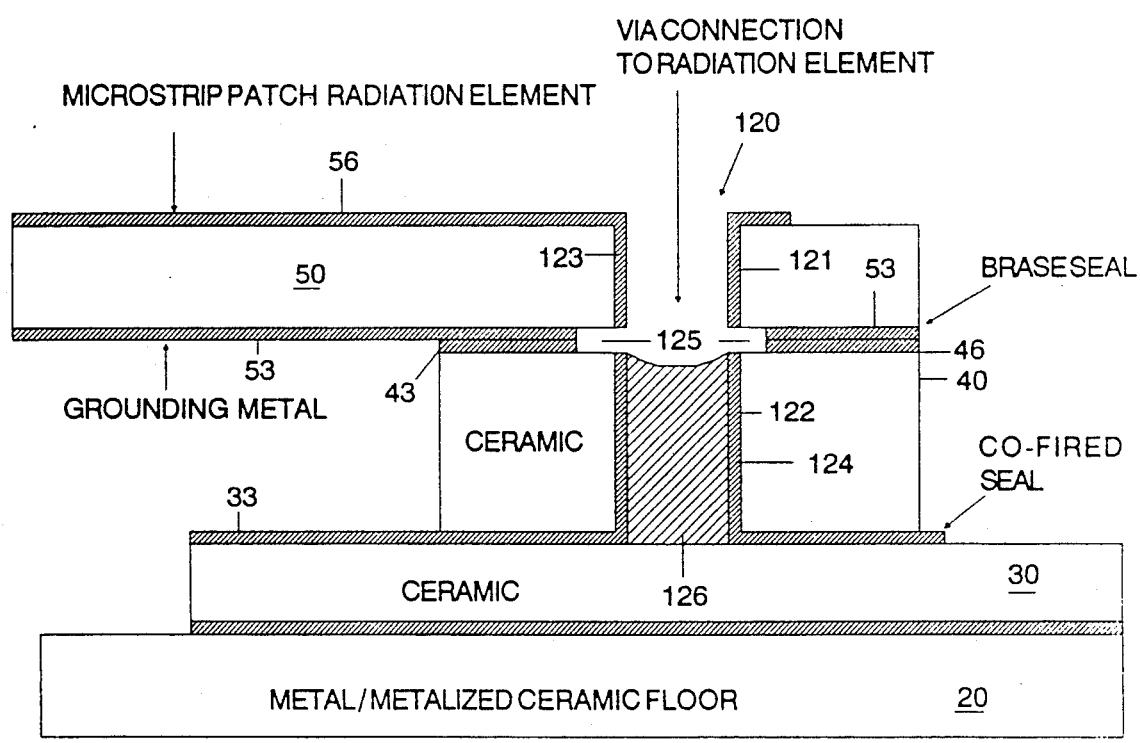
FIG. 9 illustrates a modification of the embodiment of the invention illustrated in FIGS. 1 and 2, showing an alternative scheme for coupling a signal conductor to an antenna element atop the package cover.

FIGS. 7 and 8 illustrate an embodiment of a scheme for providing external connections to the signal conductors 33, specifically at those portions overlying the ceramic layer 30 beyond the outer wall 44 of sealing ring layer 40. As shown in the diagrammatic side view of FIG. 7 and the plan illustration of FIG. 8, an external signal connection for each signal conductor 33 may be provided by way of a conductive pin 111 of Kovar having a disc-shaped head portion 112 (radius on the order of 0.020" and thickness on the order of 0.005") and a cylindrical shank portion 113 (radius on the order of 0.012") extending therefrom, the shank portion snuggly fitting within an aperture or via 114 in ceramic layer 30 and passing through a larger diameter, U-shaped cut-out region 115 in metallic base member. The disc-shaped head portion 112 is bonded to a disc-shaped extension portion 33C of signal conductor 33 on ceramic layer, which forms a capacitive reactance thereat. To compensate for the capacitive reactance of the disc-shaped portion 33C of the signal conductor, the width of the signal conductor beneath sealing ring layer 40 may be reduced at a region 33L, as shown in FIG. 8, so as to effectively increase the inductive reactance of the signal conductor 33 in series with the shunt capacitive reactance at the head portion 112 of the pin 111 and the diskshaped portion 33C of signal conductor 33. The shank portion 113 of pin 111 also forms an inductive reactance so that, like the bonding wire tuning networks described above, the external connection effectively provides an L-C-L low pass filter type impedance matching network. The degree to which the shank 113 of the pin 111 extends beneath the base member 20 will govern the magnitude of the inductive reactance component established by the shank portion 113. When the package is mounted to a further layer of interconnect, the exposed shank portion 113 will be surrounded by a dielectric material (e.g. air) and conductive side walls of a socket to which the base member 20 is connected, thus simulating a coaxial line connection through the pin. FIG. 9 illustrates a modification of the embodiment of the invention illustrated in FIGS. 1 and 2, specifically an alternative scheme for providing a signal line connection from signal conductor 33 to the antenna element 56 atop the cover layer 50. In accordance with this embodiment, conductive vias, similar to those employed for providing the ground plane cage described above in connection with the description of FIG. 3, are employed to connect signal conductor 33 to the patch antenna element 56.

For this purpose, a cylindrical aperture or via 120 having a radius on the order of 0.004" is formed through sealing ring layer 40 and cover 50. The cylindrical sidewalls 121, 122 of the respective portions of the aperture through cover 50 and sealing ring layer 40 are conductively coated or metallized with tungsten. It is to be observed that an annular portion of (ground plane) conductor layer 53 on the interior surface portion of cover 50 and the brazed seal region 46 is removed, as shown at region 125, so as to prevent shorting of the antenna and the ground plane.

In the course of assembly of the cover and the sealing ring layer, the cover is initially formed with aperture 121 therethrough and annular region 125 surrounding the aperture to provide the requisite spacing between layer 53 and the aperture. A similar braze layer 46 is formed on the top surface 43 of sealing ring layer 40. When the cover 50 is placed atop the sealing ring layer 40 and hermetically sealed therewith, the gap or region 125 surrounding aperture 120 remains, so as to prevent shorting between the ground plane and the antenna itself. A column of conductive material, such as tungsten, in part 126 and a partial fill with indium solder and confined by conductive side wall 123 of cover layer 50, is used to fill the aperture 120, so as to provide a conductively bridging contact between conductive walls 123 and 124, and thereby provide an electrical connection between the microstrip patch antenna element 56 and signal conductor 33. Surface tension prevents the indium from flowing out to layers 46 and 53.

Figure 10:
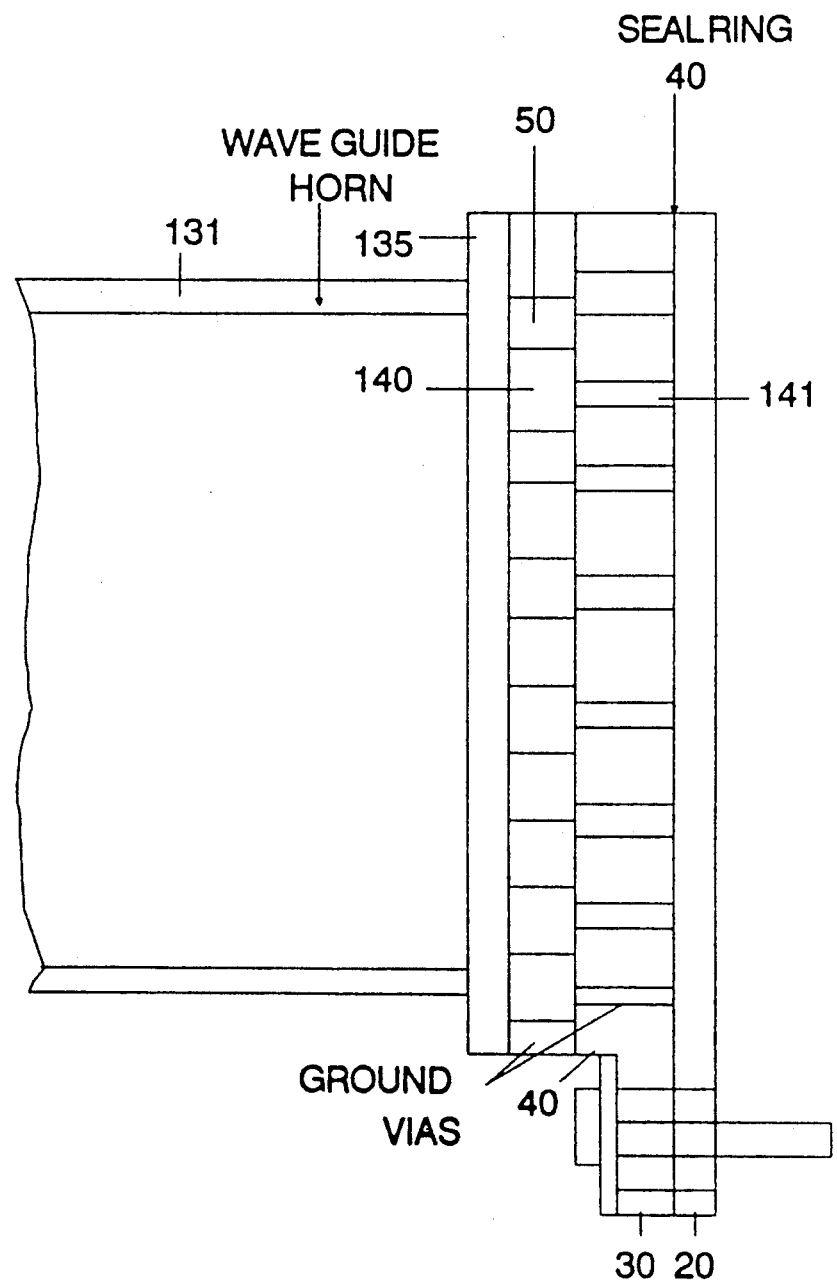
FIGS. 10 and 11 show respective diagrammatic side and end views of the use of the present invention for providing a waveguide end launch.
Figure 11:
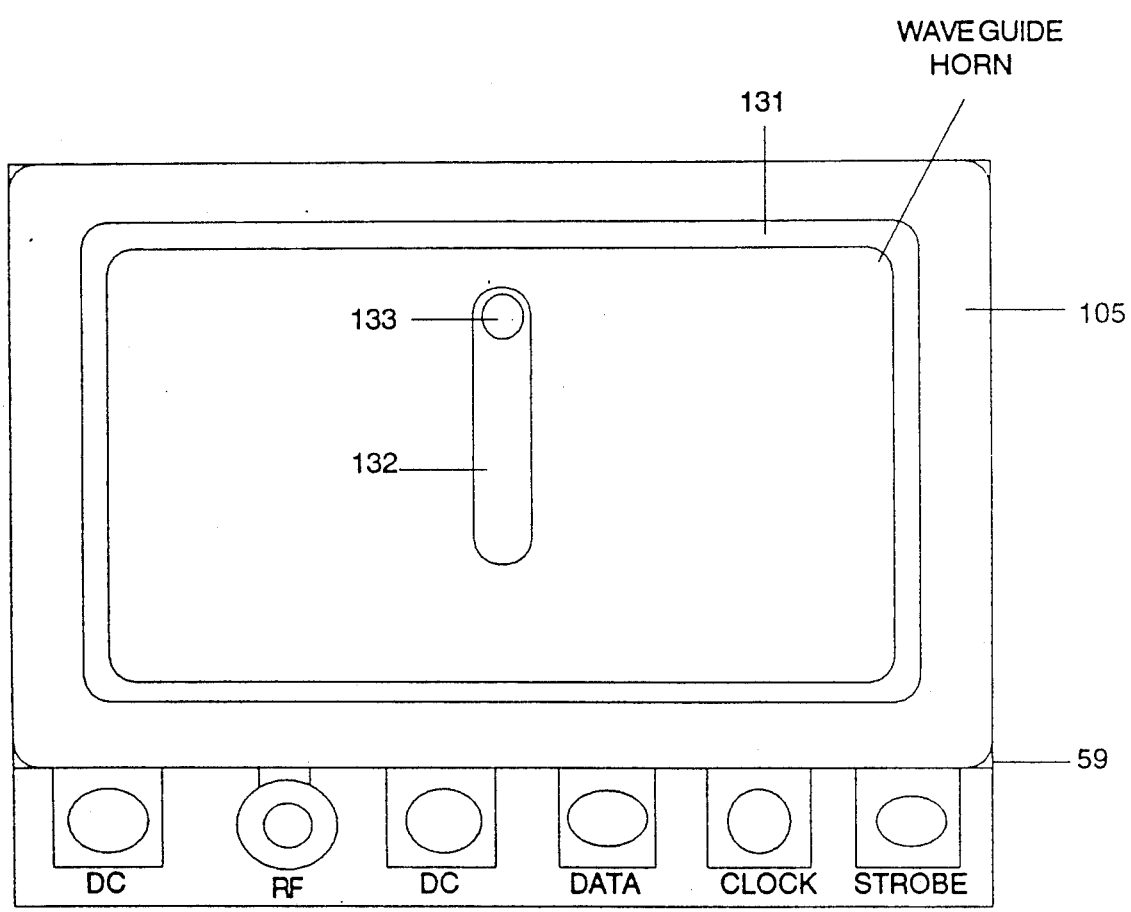

Rather than employ a microstrip patch antenna element, the antenna package of the present invention is also adapted for use with waveguide antenna components. FIGS. 10 and 11 show respective diagrammatic side and end views of the use of the present invention for providing a waveguide end launch. As shown therein, a section of rectangular waveguide 131 is mounted to the top or outer surface 51 of cover layer 50. In this embodiment, rather than provide the ground plane on the interior surface 52 of cover 50, an annular ribbon of conductor material 59 is formed on the top surface 51 of the cover 50. A flange portion 135 of the waveguide 131 is bonded to the ground plane ribbon 59. Ground plane connections to the ribbon portion 59 may be effected through a distribution of conductive vias 140 and 141 in the ceramic sealing ring layer and cover, similar to those shown in FIGS. 3 and 9, to provide a ground plane cage-like arrangement of conductive cylindrical post regions around the perimeter of the package.

A waveguide launch probe is provided by way of a conductive layer 132 on the top surface 51 of cover layer 50, spaced apart from the ground plane ribbon 59. A feed-through post 133 extends from the launch probe layer 132 through a via in the ceramic cover 50 to a signal conductor on the interior surface 52 of the cover 50. This signal conductor may extend to a conductive layer on the interior sidewall 41 of the sealing ring layer 40, as shown in FIG. 1, to the signal conductor 33 on layer 30.

In the plan view of an individual waveguide antenna package shown in FIG. 11, external connections are shown by way of a plurality of pins 141 extending along one edge of the package. Advantageously, this arrangement permits the package to be readily coupled to a variety of signal transmission line structures which provide distributed/periodic interface ports.

Figure 12:
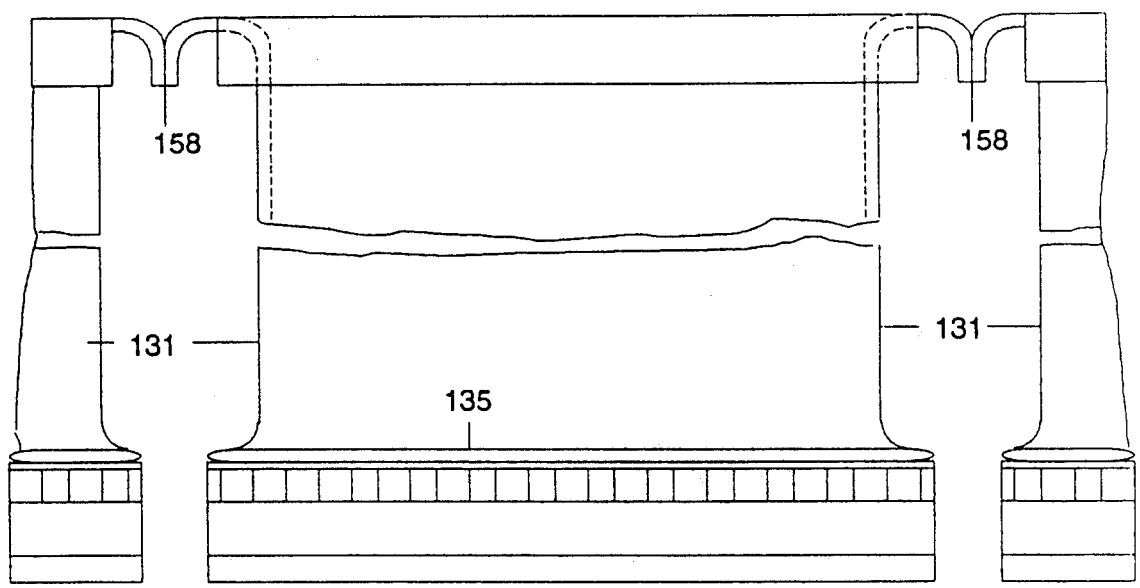
FIGS. 12 and 13 show how the present invention is mounted to a waffleline.

An example of one such scheme, termed 'waffleline', is described in U.S. Pat. No. 4,695,810 entitled "Waffleline Configured Microwave Transmission Link", by D. Heckaman et al, issued Sept. 22, 1987, and assigned to the Assignee of the present application. Because of its configuration, the carrier package of the present invention is readily mountable to waffleline so that a plurality of such packages may be compactly nested together to facilitate the formation of a phased array antenna. Where horn antennas are employed, the outer edges of the waveguide may be provided with U-shaped grounding spring fingers as illustrated in FIG. 12 at 158 to provide electrical continuity among the sections of waveguide 131.

Figure 13:
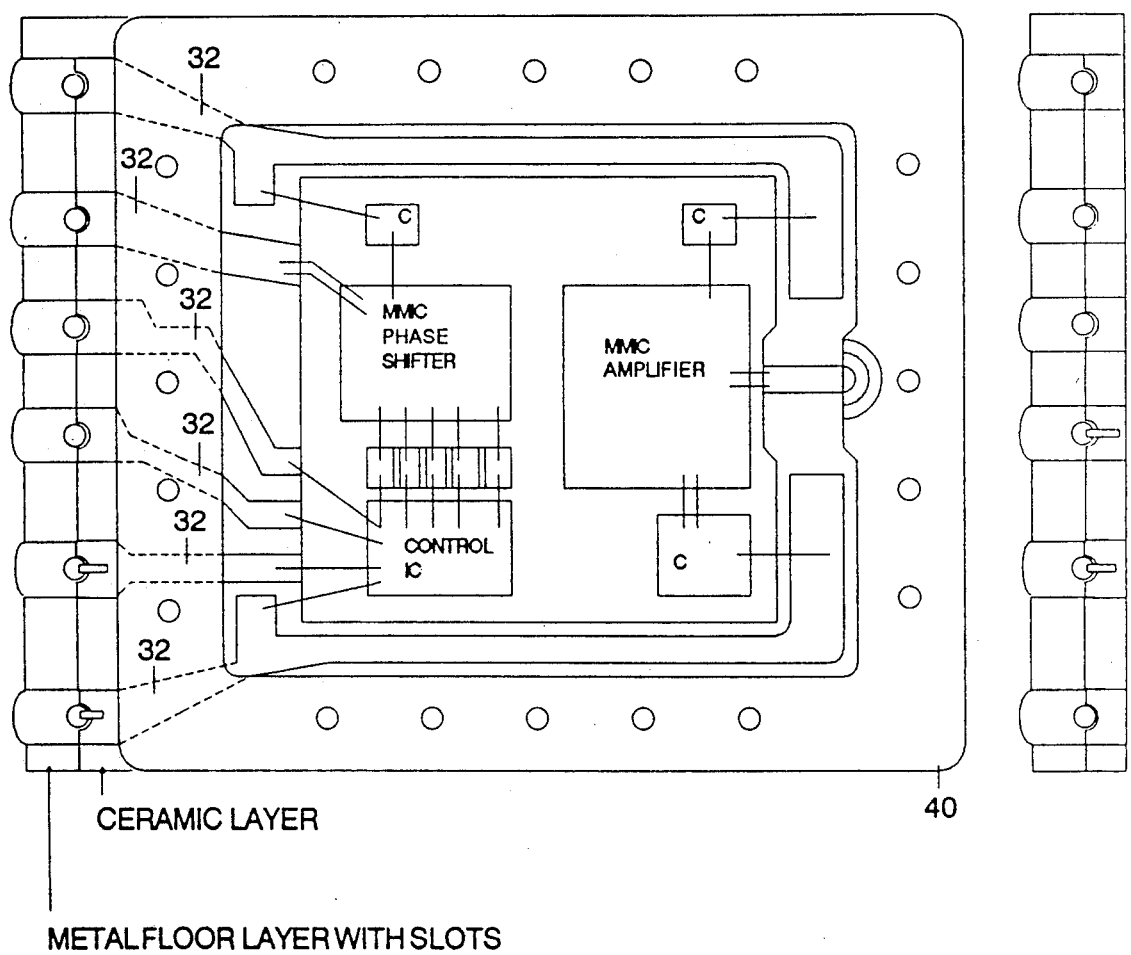

FIG. 13 is a diagrammatic plan illustration of the manner in which a plurality of chip carrier packages in accordance with the present invention may be mounted to a matrix type of transmission line, such as waffleline, referenced above.

As will be appreciated form the foregoing description, the present invention provides a practical mechanism for packaging miniaturized monolithic RF communications systems with a configuration which enables both the signal processing circuitry components of the system and their associated radiation elements to be integrated in compact support structure. Because the invention is not limited to a specific type of chip of carrier configuration, it may be used to package a variety of microwave circuits components (as contrasted with the custom design approaches of conventional packaging schemes). In addition because of its compact size the invention is capable of meeting conformal mounting needs of advanced technology aircraft designs and readily lends itself to applications where high density is required, such as phased array antenna systems.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A support package for a microwave integrated circuit component and an antenna therefor comprising:
   a base member upon which said microwave integrated circuit component is mountable;
   a first insulation layer mounted on said base member and supporting at least one signal conductor on a location adjacent to a signal lead on said circuit component;

a second insulation layer supported on said first insulation layer and surrounding the location whereat said circuit component is mountable;

a third insulation layer supported on said second insulation layer and forming a cover for said package, so as to define, with said base member and said first and second insulation layers, a cavity within which said circuit component is housed;

an antenna element supported on an outer surface of said third layer; and means for connecting a signal conductor supported by said first insulation layer to said antenna element, and wherein said second insulation layer is hermetically sealed at an interface formed with said first insulation layer upon which said second insulation layer is supported, and said third insulation layer is hermetically sealed at an interface formed with said second insulation layer upon which said third insulation layer is supported, and wherein said first insulation layer has a first surface on which said at least one signal conductor is formed and on which said second insulation layer is supported, and said second insulation layer has a dimension in a radial direction outwardly from the location of said circuit component such that said at least one signal conductor extends over the surface of said first insulation layer beyond the outer perimeter of said second insulation layer thereon.

2. A support package according to claim 1, further comprising at least one conductor element respectively electrically connected to said at least one signal conductor at a portion thereof whereat said at least one signal conductor extends over the surface of said first insulation layer beyond the outer perimeter of said second insulation layer thereon and extending through said first insulation layer and said base member.

3. A support package according to claim 2, wherein said conductor element comprises a conductor pin having a head portion connected to a signal conductor and a shank portion extending from said head portion and passing through an aperture in said first insulation layer and said base member.

4. A support package for a microwave integrated circuit component and an antenna therefor comprising:
a base member upon which said microwave integrated circuit component is mountable;
a first insulation layer mounted on said base member and supporting at least one signal conductor on a location adjacent to a signal lead on said circuit component;
a second insulation layer supported on said first insulation layer and surrounding the location whereat said circuit component is mountable;
a third insulation layer supported on said second insulation layer and forming a cover for said package, so as to define, with said base member and said first and second insulation layers, a cavity within which said circuit component is housed;
an antenna element supported on an outer surface of said third layer; and
means for connecting a signal conductor supported by said first insulation layer to said antenna element, and wherein
said second insulation layer is hermetically sealed at an interface formed with said first insulation layer upon which said second insulation layer is supported, and said third insulation layer is hermetically sealed at an interface formed with said second insulation layer upon which said third insulation layer is supported, and wherein
said antenna element includes a layer of conductive material formed on said outer surface of said third insulation layer, and wherein
said third insulation layer has a layer of conductive material formed on an interior surface thereof, and further including at least one conductive path electrically connecting said base member and the layer of conductive material formed on the interior surface of said third insulation layer.

5. A support package according to claim 4, wherein said conductive path is comprised of an aperture extending through said first and second insulation layers, said aperture containing conductive material therein which is contiguous with said base member and the layer of conductive material formed on the interior surface of said third insulation layer.

6. A support package according to claim 5, wherein said base member comprises thermally and electrically conductive material.

7. A support package according to claim 6, wherein said insulation layers are formed of ceramic material.

8. A support package according to claim 4, wherein said at least one conductive path is comprised of a plurality of conductive paths extending through respective apertures in said first and second insulation-members and distributed around the location within said cavity whereat said circuit component is mountable on said base member.

9. A support package according to claim 8, wherein a conductive path is comprised of an aperture extending through said first and second insulation layers, said aperture containing conductive material therein which is contiguous with said base member and the layer of conductive material formed on the interior surface of said third insulation layer.

10. A support package for a microwave integrated circuit component and an antenna therefor comprising:
a base member upon which said microwave integrated circuit component is mountable;
a first insulation layer mounted on said base member and supporting at least one signal conductor on a location adjacent to a signal lead on said circuit component;
a second insulation layer supported on said first insulation layer and surrounding the location whereat said circuit component is mountable;
a third insulation layer supported on said second insulation layer and forming a cover for said package, so as to define, with said base member and said first and second insulation layers, a cavity within which said circuit component is housed;
an antenna element supported on an outer surface of said third layer; and
means for connecting a signal conductor supported by said first insulation layer to said antenna element, and wherein
said second insulation layer is hermetically sealed at an interface formed with said first insulation layer upon which said second insulation layer is supported, and said third insulation layer is hermetically sealed at an interface formed with said second insulation layer upon which said third insulation layer is supported, further including
means for providing electrical bonding connections between bonding pads on a microwave integrated circuit component mounted on said base member and signal conductors supported by said first insulation layer, and further including respective inductive/capacitive networks, each of which provides, with a respective electrical bonding connection means, an impedance match between a respective signal lead on said circuit component and said signal conductor supported by said first insulation layer.

11. A support package according to claim 10, wherein said first insulation layer has a first surface on which said at least one signal conductor is formed and on which said second insulation layer is supported, and wherein a respective inductive/capacitive network comprises conductive material selectively formed on said first surface of said first insulation layer between a respective bonding connection means and a signal line.

12. A support package according to claim 10, wherein said base member has a conductive lip portion disposed between the location whereat said circuit component is mountable on said first insulation layer, and wherein a respective inductive/capacitive network includes a layer of dielectric material formed on said conductive lip portion adjacent to a respective bonding connection means, so that a capacitive element is formed between a respective bonding connection means and said lip portion and an inductive element is formed of a portion of said respective bonding connection means adjacent to said capacitive element.

13. A support package for a microwave integrated circuit component and an antenna therefor comprising:

a microwave integrated circuit component carrier having a base portion upon a first surface of which said microwave integrated circuit component is mounted, said microwave integrated circuit component having a mounting surface that is parallel to and mounted upon said first surface of said microwave integrated circuit component carrier, a surrounding wall portion extending from said base portion and a cover portion atop said wall portion, said base portion, wall portion and cover portion enclosing a hermetically sealed cavity within which said microwave integrated circuit component is to be supportable on said base portion, said cover portion having an outer surface that extends in a plane that is substantially parallel to the microwave integrated circuit component-mounting surface of said base portion;

an antenna element supported on said outer surface of said cover portion, a major dimension of said antenna lying in a plane that is generally parallel to the plane of the outer surface of said cover portion upon which said antenna element is supported, so that said antenna radiates in a direction that is generally orthogonal to the plane of the outer surface of said cover portion; and means for providing a signal path from a circuit component mounted within said cavity to said antenna element.

14. A support package according to claim 13, wherein said signal path providing means comprises a signal conductor path supported by said wall portion of said carrier.

15. A support package according to claim 14, wherein said signal conductor path extends through said wall portion of said carrier.

16. A support package according to claim 13, wherein said antenna element includes a layer of conductive material formed on an outer surface of the cover portion of said carrier.

17. A support package according to claim 16, wherein said antenna element is electromagnetically coupled to a section of waveguide supported on the cover portion of said carrier and extends in a direction orthogonal to the outer surface of said cover portion.

18. A support package according to claim 17, wherein said layer of conductive material is disposed within the interior of one end of said section of waveguide and provides an electromagnetic wave interface between said section of waveguide and said signal path providing means.

19. A support package according to claim 13, wherein the wall portion of said carrier comprises a first insulation layer having a first surface on which at least one signal conductor is formed and a second insulation layer supported on said first insulation layer, said second insulation layer having a dimension in a radial direction outwardly from the location whereat a circuit component is mountable on the base portion of said carrier such that said at least one signal conductor extends over the surface of said first insulation layer beyond the outer perimeter of said second insulation layer thereon.

20. A support package according to claim 19, wherein said signal path providing means comprises at least one conductor element respectively electrically connected to said at least one signal conductor at a portion thereof whereat said at least one signal conductor extends over the surface of said first insulation layer beyond the outer perimeter of said second insulation layer thereon and extending through said first insulation layer and the base portion of said carrier.

21. A support package according to claim 20, wherein the cover portion of said carrier comprises a third insulation layer having a layer of conductive material formed on an interior surface thereof, and further including at least one conductive path electrically connecting the base portion of said carrier and the layer of conductive material formed on the interior surface of said third insulation layer.

22. A support package according to claim 21, wherein said conductive path is comprised of an aperture extending through said first and second insulation layers, said aperture containing conductive material therein which is contiguous with the base portion of said carrier and the layer of conductive material formed on the interior surface of said third insulation layer.

23. A support package according to claim 21, wherein said at least one conductive path is comprised of a plurality of conductive paths extending through respective apertures in said first and second insulation members and distributed around the location within said cavity whereat said circuit component is mountable on the base portion of said carrier.

24. A support package according to claim 23, wherein a conductive path is comprised of an aperture extending through said first and second insulation layers, said aperture containing conductive material therein which is contiguous with the base portion of said carrier and the layer of conductive material formed on the interior surface of said third insulation layer.

25. A support package according to claim 19, further including means for providing electrical bonding connections between bonding pads on a microwave integrated circuit component mounted on the base portion of said carrier and signal conductors supported by said first insulation layer.

26. A support package according to claim 25, further including respective inductive/capacitive networks, each of which provides, with a respective electrical bonding connection means, an impedance match between a respective signal lead on said circuit component and a signal conductor supported by said first insulation layer.

27. A support package according to claim 13, wherein said wall portion is hermetically sealed at an interface formed with said base portion and said cover portion is hermetically sealed at an interface formed with said wall portion of said carrier.

* * * * *